(12) United States Patent
Toba et al.

(10) Patent No.: US 7,425,845 B2
(45) Date of Patent: Sep. 16, 2008

(54) SEMICONDUCTOR INTEGRATED CIRCUIT

(75) Inventors: Takeo Toba, Tokyo (JP); Kazuo Tanaka, Tokyo (JP); Shunsuke Toyoshima, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 59 days.

(21) Appl. No.: 11/452,238

(22) Filed: Jun. 14, 2006

(65) Prior Publication Data
US 2007/0019493 A1 Jan. 25, 2007

(30) Foreign Application Priority Data
Jul. 22, 2005 (JP) .............................. 2005-212257

(51) Int. Cl.
*H03K 19/0185* (2006.01)
(52) U.S. Cl. .............................. 326/80; 326/81; 326/83; 327/333
(58) Field of Classification Search .................... 326/63, 326/68, 80, 81; 327/333
See application file for complete search history.

(56) References Cited

U.S. PATENT DOCUMENTS 5,982,705 A * 11/1999 Tsukikawa ............. 365/230.08
6,094,067 A * 7/2000 Taniguchi ..................... 326/81
6,774,695 B2 * 8/2004 Hayashi et al. ............. 327/333

FOREIGN PATENT DOCUMENTS

JP 11-111946 10/1997

* cited by examiner

*Primary Examiner*—Daniel D Chang
(74) *Attorney, Agent, or Firm*—Reed Smith LLP; Stanley P. Fisher, Esq.; Juan Carlos A. Marquez, Esq.

(57) ABSTRACT

The present invention provides a semiconductor integrated circuit having two kinds of input/output circuits realizing higher speed and higher packing density with rational configuration. The semiconductor integrated circuit has a first input/output circuit operating on a first power source voltage, an internal circuit operating on a second power source voltage lower than the first power source voltage, and a second input/output circuit operating on a third power source voltage lower than the first power source voltage. In an output circuit of the first input/output circuit, signal amplitude corresponding to the second power source voltage is converted to signal amplitude corresponding to the first power source voltage by a level shifter, and a P-channel MOSFET and an N-channel MOSFET constructing the output circuit are driven. In an output circuit of the second input/output circuit, a drive signal is generated by a level shifter in a manner similar to the above to drive second and third N-channel MOSFETs for generating an output signal having signal amplitude corresponding to the third power source voltage.

12 Claims, 11 Drawing Sheets

SEMICONDUCTOR INTEGRATED CIRCUIT

CROSS-REFERENCE TO RELATED APPLICATION

The present application claims priority from Japanese patent application No. 2005-212257 filed on Jul. 22, 2005, the content of which is hereby incorporated by reference into this application.

BACKGROUND OF THE INVENTION

The present invention relates to a semiconductor integrated circuit and, more particularly, a technique suitably used for an input/output circuit in the semiconductor integrated circuit.

Japanese Unexamined Patent Publication No. Hei 11 (1999)-111946 discloses a technique using a push-pull output circuit made by an N-channel MOSFET as an output buffer of a semiconductor memory device. To drive the output buffer, an internal boost circuit is provided.

SUMMARY OF THE INVENTION

A semiconductor integrated circuit such as a microprocessor is generally provided with an interface that operates on a relatively high voltage such as 3.3V to transmit/receive signals to/from peripheral circuits. On the other hand, some internal logic circuit of the microprocessor operates on a low voltage such as 1.2V in order to achieve higher speed and lower power consumption. In high-speed memories such as DDR SDRAM (Double Data Rate Synchronous Dynamic Random Access Memory), the power source voltage tends to be lowered to 1.8V or the like in order to achieve higher speed and higher packing density. Through technical studies of mounting an interface which can be directly coupled to a semiconductor integrated circuit operating on such a low voltage on the microprocessor, the present invention has been achieved.

An object of the present invention is to provide a semiconductor integrated circuit having two kinds of input/output circuits realizing higher speed and higher packing density with a rational configuration. The above and other objects and novel features of the present invention will become apparent from the description of the specification and appended drawings.

Outline of typical one of inventions disclosed in the application will be briefly described as follows. A semiconductor integrated circuit has a first input/output circuit operating on a first power source voltage, an internal circuit operating on a second power source voltage lower than the first power source voltage, and a second input/output circuit operating on a third power source voltage lower than the first power source voltage. In an output circuit of the first input/output circuit, signal amplitude corresponding to the second power source voltage is converted to signal amplitude corresponding to the first power source voltage by a level shifter, and a P-channel MOSFET and an N-channel MOSFET constructing the output circuit are driven. In an output circuit of the second input/output circuit, a drive signal is generated by a level shifter in a manner similar to the above to drive N-channel MOSFETs of a push-pull output circuit for generating an output signal having signal amplitude corresponding to the third power source voltage.

By using the output circuit of the first input/output circuit adapted to the first power source voltage and changing only the output MOSFET part in the output circuit of the second input/output circuit adapted to the third power source voltage, higher speed and higher packing density can be realized.

DETAILED DESCRIPTION OF THE PREFERRED EMBODIMENTS

Figure 1:
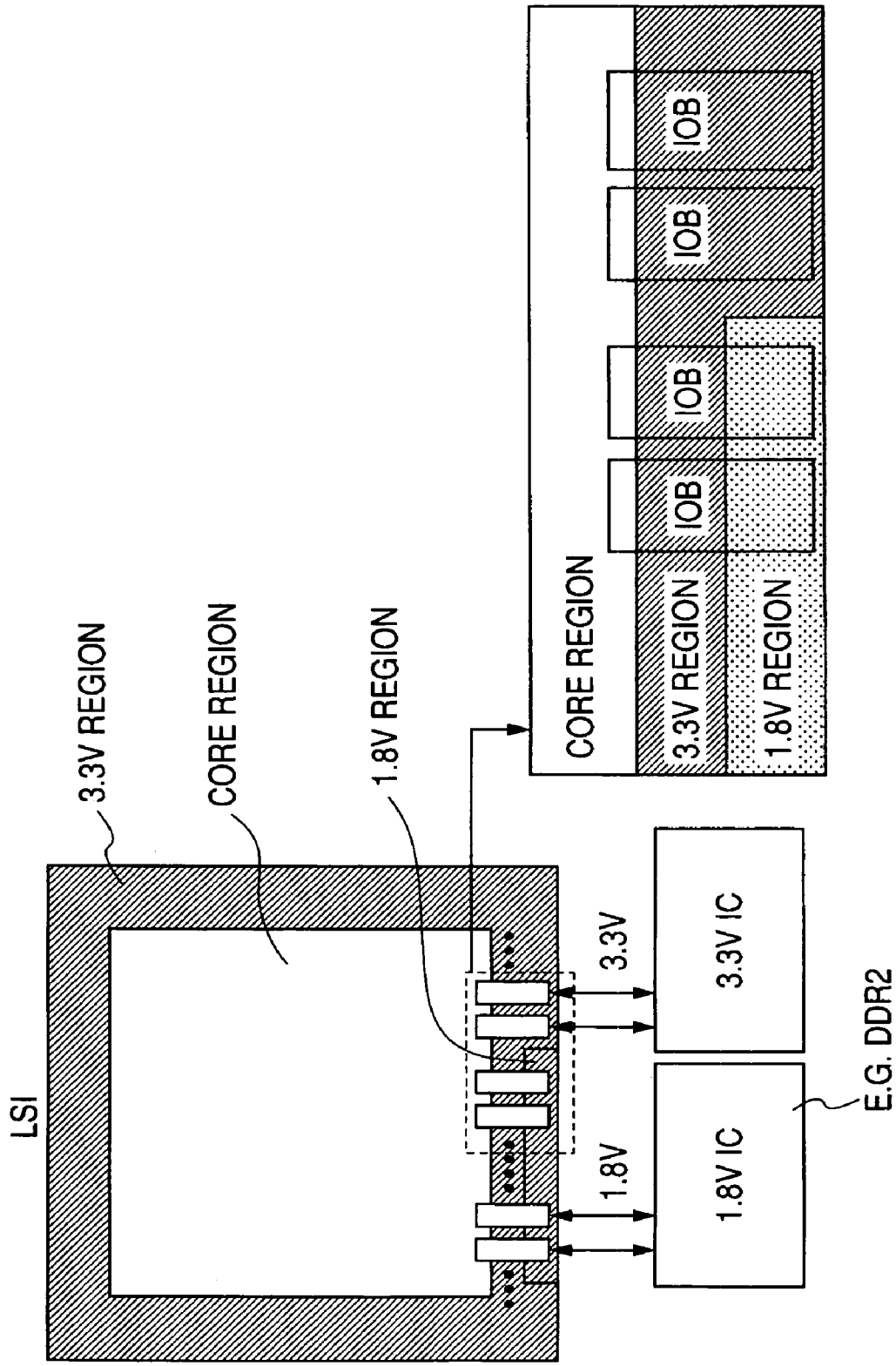
FIG. 1 is a schematic configuration diagram showing an example of a semiconductor, integrated circuit according to the present invention.

FIG. 1 is a schematic configuration diagram showing an example of a semiconductor integrated circuit according to the present invention. A semiconductor integrated circuit LSI is formed on a semiconductor substrate such as a silicon substrate by a known CMOS integrated circuit manufacturing technique. An input/output circuit part is provided in the peripheral part of the semiconductor integrated circuit, and internal circuits are provided in a core region surrounded by the input/output circuit part. In the embodiment, although not limited, the input/output circuits operate on three kinds of power source voltages such as 3.3V, 1.2V, and 1.8V. The power source voltages are supplied to the semiconductor integrated circuit LSI via external terminals.

The input/output circuit part includes an input/output circuit having a CMOS output circuit for generating an output signal adapted to 3.3V, and an input/output circuit having a push-pull output circuit made by an N-channel MOSFET for generating an output signal adapted to 1.8V. The two kinds of output circuits use similar level shifters, three-state output control circuits, and pre-buffers as input-side circuits, and MOSFETs having a similar withstand voltage structure as output MOSFETs.

The whole input/output circuit having the CMOS output circuit for generating an output signal adapted to 3.3V is formed in a 3.3V region and is connected to, for example, a 3.3V IC. On the other hand, the front part of the input/output circuit having the push-pull output circuit made by an N-channel MOSFET for generating an output signal adapted to 1.8V is included in the 3.3V region, and part of an output circuit and an input circuit is formed in a 1.8V region. The 1.8V signal is directly transmitted to a 1.8V IC. An example of the 1.8V IC is a high-speed memory such as a DDR2

SDRAM. The core region surrounded by the 3.3V region constructing the input/output circuits is set as a low-voltage region of, for example, 1.2V or less unrelated to the signal levels of external ICs connected to the semiconductor integrated circuit LSI.

As partly enlargedly shown, the input/output circuit part is constructed by a 3.3V input/output circuit and a 1.8V input/output circuit. Specifically, in the 3.3V input/output circuit, the level shifter includes a part operating on 1.2V corresponding to the core region. Except for the part, the 3.3V input/output circuit is constructed by a CMOS circuit operating on a power source voltage such as 3.3V. The 1.8V input/output circuit uses a front-stage circuit similar to that of the 3.3V input/output circuit, and uses a push-pull output circuit in which only an output MOSFET is an N-channel MOSFET. Further, the gate withstand voltage structure of the MOSFET constructing the push-pull output circuit is the same as that of the MOSFET of the 3.3V input/output circuit.

Figure 2:
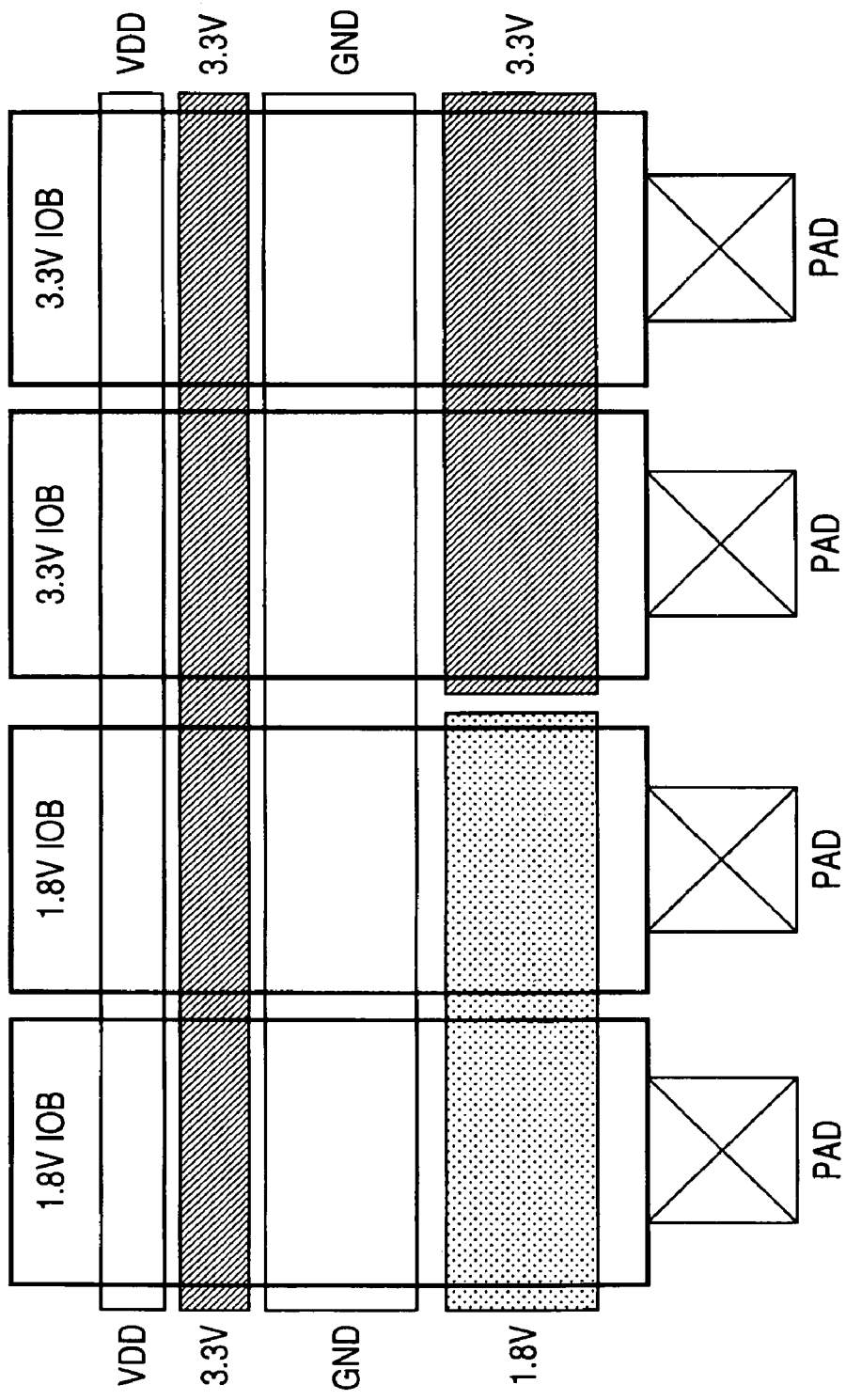
FIG. 2 is a diagram of a power source wiring layout showing an example of an input/output circuit in FIG. 1.

FIG. 2 is a diagram showing a power source wiring layout of an example of the input/output circuit of FIG. 1. 3.3V IOBs (input/output circuits) and 1.8V IOBs (input/output circuits) are arranged in correspondence with pads PAD provided along the periphery of the semiconductor chip. A 3.3V power supply line and a 1.8V power supply line are disposed on the outermost side of the semiconductor chip, that is, on the side of the pads PAD. The 3.3V power supply line is provided in the entire periphery of the chip of FIG. 1 and is replaced with the 1.8V power supply line in parts in which the 1.8V IOBs are provided. Therefore, the two power supply lines of 3.3V and 1.8V extend on a straight line.

A ground line GND of the circuit is provided in a ring shape so as to be adjacent to the inner side of each of the power supply lines of 3.3V and 1.8V at the periphery of the semiconductor chip. The ground line GND is commonly used by the power supply lines of 3.3V and 1.8V. The power supply line of 3.3V is provided in a ring shape so as to be adjacent to the inner side of the ground line GND. 3.3V of the power supply line is an operation voltage of a level shifter, a pre-buffer, and the like which will be described later and is commonly used by the 3.3V IOBs and the 1.8V IOBs. Therefore, the power supply line of 3.3V is formed in the ring shape in a manner similar to the ground line GND. The ground line GND is also commonly used by the power supply line of 3.3V. On the innermost side, a power supply line VDD corresponding to the core region of 1.2V or the like for the level shifter is disposed similarly in a ring shape.

The 3.3V power supply line and the 1.8V power supply line are connected to not-shown power supply pads PAD, and power source voltages such as 3.3V and 1.8V are supplied via the power supply pads PAD. The power supply line of 3.3V as an operation voltage of the level shifter, the pre-buffer, and the like may be connected to the 3.3V power supply line on the outermost side. Alternately, to avoid the influence of noise which occurs in the power source lines in an output operation of the output circuit, an independent power supply pad PAD may be provided to supply a power source voltage such as 3.3V.

Figure 3:
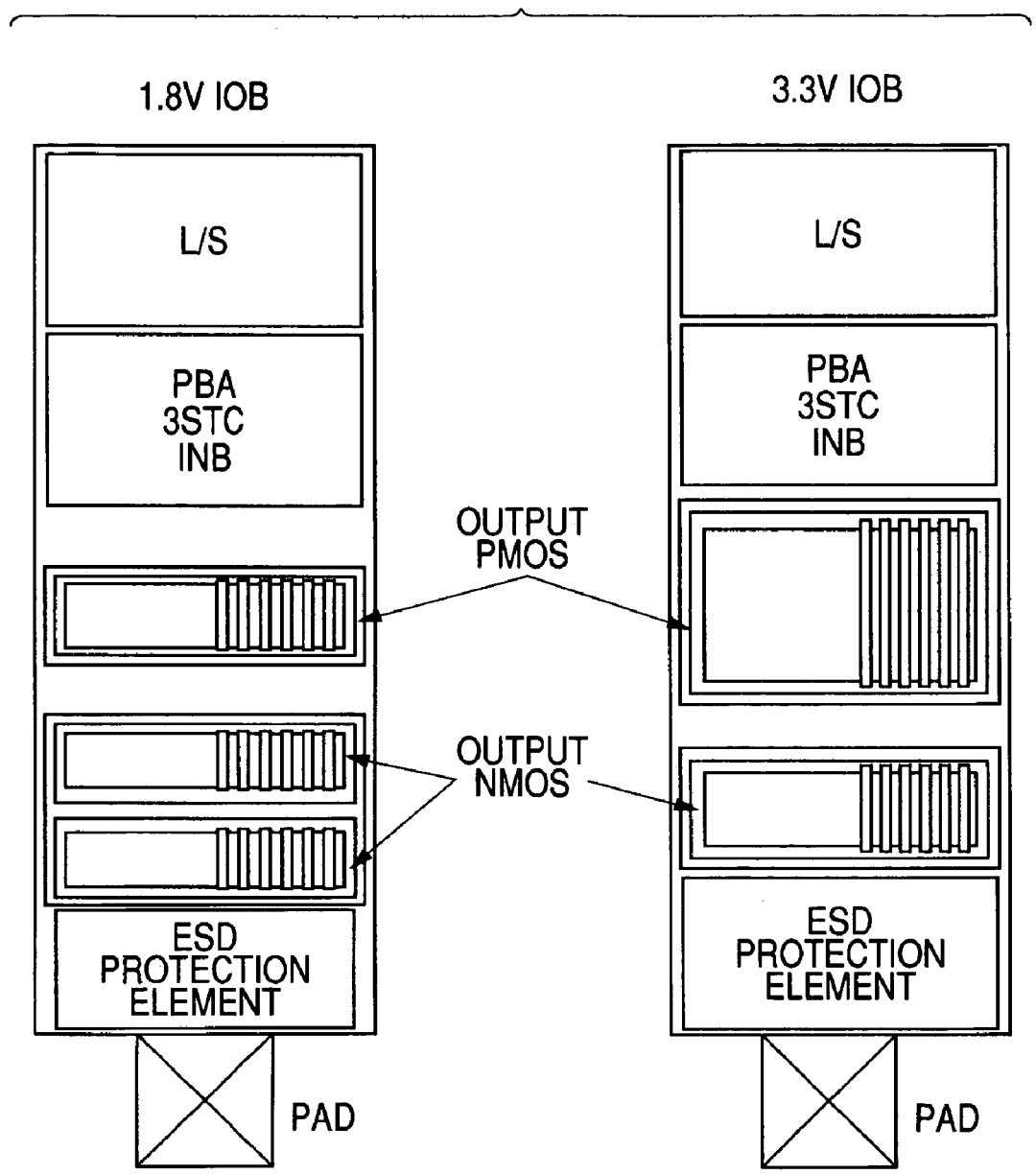
FIG. 3 is a layout diagram showing an example of the input/output circuit in FIG. 1.

FIG. 3 is a layout diagram of an example of the input/output circuits in FIG. 1. The 3.3V IOB and the 1.8V IOB are constructed by similar circuits such as a level shifter L/S, a pre-buffer PBA, a three-state output control circuit 3STC, and an input circuit INB. The input circuit INB of the 3.3V IOB operates on 3.3V, and the input circuit INB of the 1.8V IOB operates on 1.8V. Similar ESD (electrostatic) protection elements are provided between the 3.3V IOB and the pad PAD corresponding to an external terminal and between the 1.8V IOB and the pad PAD corresponding to an external terminal.

An output circuit of the 3.3V IOB takes the form of a CMOS circuit constructed by a P-channel output MOSFET (output PMOS) and an N-channel output MOSFET (output NMOS). An output circuit of the 1.8V IOB takes the form of a push-pull output circuit constructed by an N-channel output MOSFET (output NMOS). As will be described later, the P-channel MOSFET (output PMOS) provided for the output circuit of the 1.8V IOB is provided for compensating an output level and low current drivability may be sufficient, so that the size of the P-channel MOSFET may be smaller than that of the output PMOS of the 3.3V IOB.

In the MOSFET in the output circuit, as illustrated in the diagram, a plurality of gate electrodes extending in the vertical direction are arranged in the horizontal direction. Semiconductor regions sandwiched by the gate electrodes are disposed so as to construct sources and drains alternately, and a plurality of unit MOSFETs each corresponding to one gate electrode are connected in parallel, thereby forming one output MOSFET. The semiconductor region sandwiched by the gate electrodes serves as a source or drain shared by two unit MOSFETs. Although not limited, in the 1.8V IOB, in correspondence with small signal amplitude of the 1.8V IOB, the gate width of the unit MOSFET in the output NMOS is set to be shorter than that of the output NMOS of the 3.3V IOB and the current drivability is set to be low. The output MOSFET on the power source voltage side also takes the form of an N-channel MOSFET, and its occupation area can be made smaller as compared with the output PMOS and the output NMOS in the 3.3V IOB. Except for the above, the MOSFETs of the output circuit of the 1.8V IOB and the output circuit of the 3.3V IOB are MOSFETs formed by the same manufacturing process.

As described above, most of circuit elements of the 3.3V IOB and the 1.8V IOB are common like the front-side circuits and the ESD protection elements except that the output circuit part is the CMOS output circuit or the push-pull output circuit formed by the N-channel MOSFET. Since the same device manufacturing process is used, designing and manufacturing is facilitated.

Figure 4:
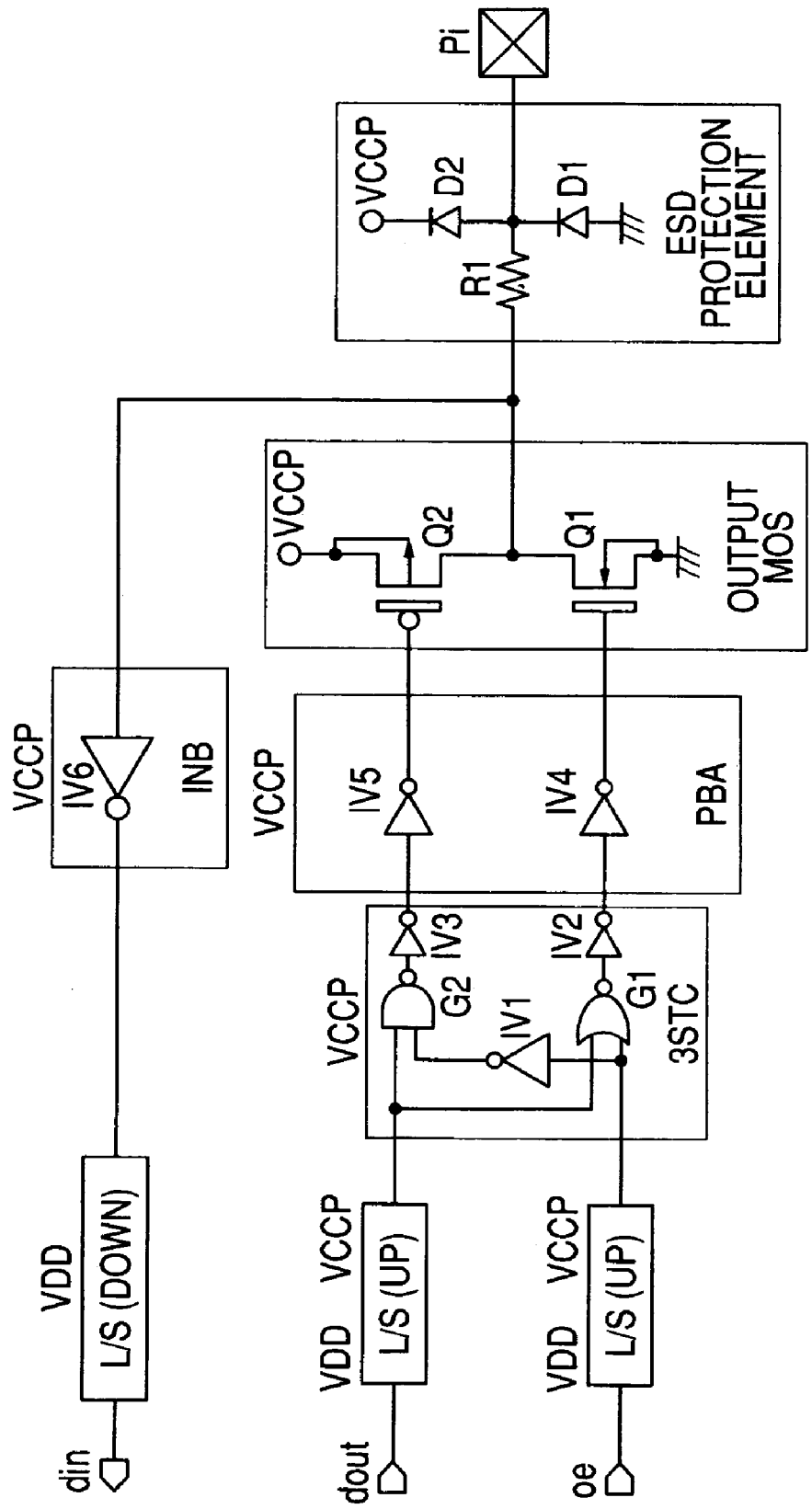
FIG. 4 is a circuit diagram showing an example of a 3.3V input/output circuit in FIG. 1.

FIG. 4 is a circuit diagram showing an example of the 3.3V input/output circuit. Although not limited, in the example, the internal circuit operates on a low voltage such as 1.2V and, on the other hand, the input/output circuit performs operations of inputting/outputting a signal of a high voltage level such as 3.3V. Consequently, the level shifter L/S is provided on the internal circuit side of the input/output circuit of the example. The output circuit includes a level shifter L/S (UP), a three-state output control circuit 3STC, a pre-buffer PBA, an output N-channel MOSFET Q1, and an output P-channel MOSFET Q2. The commonly connected drains of the output MOSFETs Q1 and Q2 are connected to an external terminal Pi via an ESD protection element including a resistor R1 and diodes D1 and D2.

The level shifter L/S (UP) operates on the internal power source voltage VDD such as 1.2V and the power source voltage VCCP such as 3.3V, and the other circuits operate on the power source voltage VCCP such as 3.3V. The output circuit has the three-state output function including an output high-impedance state in accordance with an output control signal oe. In the input/output circuit performing signal outputting operation and signal inputting operation from a common external terminal Pi, the output circuit has to be set in an output high-impedance state in order to perform the signal inputting operation.

When the output control signal oe is at the high level (logic 1), the three-state output control circuit 3STC forcedly sets output signals of a NOR gate circuit G1 and a NAND gate circuit G2 to the low level and the high level by the level shifters L/S (UP). Since the signals are inverted by inverter circuits IV2 and IV3 and the inverted signals are transmitted to CMOS inverter circuits IV4 and IV5 constructing the pre-buffer PBA, both of the N-channel output MOSFET Q1 and the P-channel output MOSFET Q2 are turned off.

When the output control signal oe is at the low level (logic 0), in the three-state output control circuit 3STC, the NOR gate circuit G1 and the NAND gate circuit G2 generate high level and low level signals by the level shifters L/S (UP) in correspondence with the low level and high level of an output signal dout. The high level/low level signals of the gate circuits G1 and G2 are inverted by the inverter circuits IV2 and IV3 and the inverted signals are transmitted to the CMOS inverter circuits IV4 and IV5 constructing the pre-buffer PBA. Therefore, when output signals of the pre-buffer PBA are at the high level, the N-channel output MOSFET Q1 is turned on, the P-channel output MOSFET Q2 is turned off, and a low-level signal is output from the external terminal Pi. When output signals of the pre-buffer PBA are at the low level, the N-channel output MOSFET Q1 is turned off, the P-channel output MOSFET Q2 is turned on, and the external terminal Pi outputs a high-level signal.

The output nodes of the output MOSFETs Q1 and Q2 are connected to an input terminal of the input buffer INB. The input buffer INB is constructed by a CMOS inverter circuit IV6, an output signal of the input buffer INB is level-shifted to a low-amplitude signal such as 1.2V by a level shifter L/S (DOWN), and the low-amplitude signal is transmitted to an internal circuit. A signal din obtained from the level shifter L/S (DOWN) is transmitted to the internal circuit.

Figure 5:
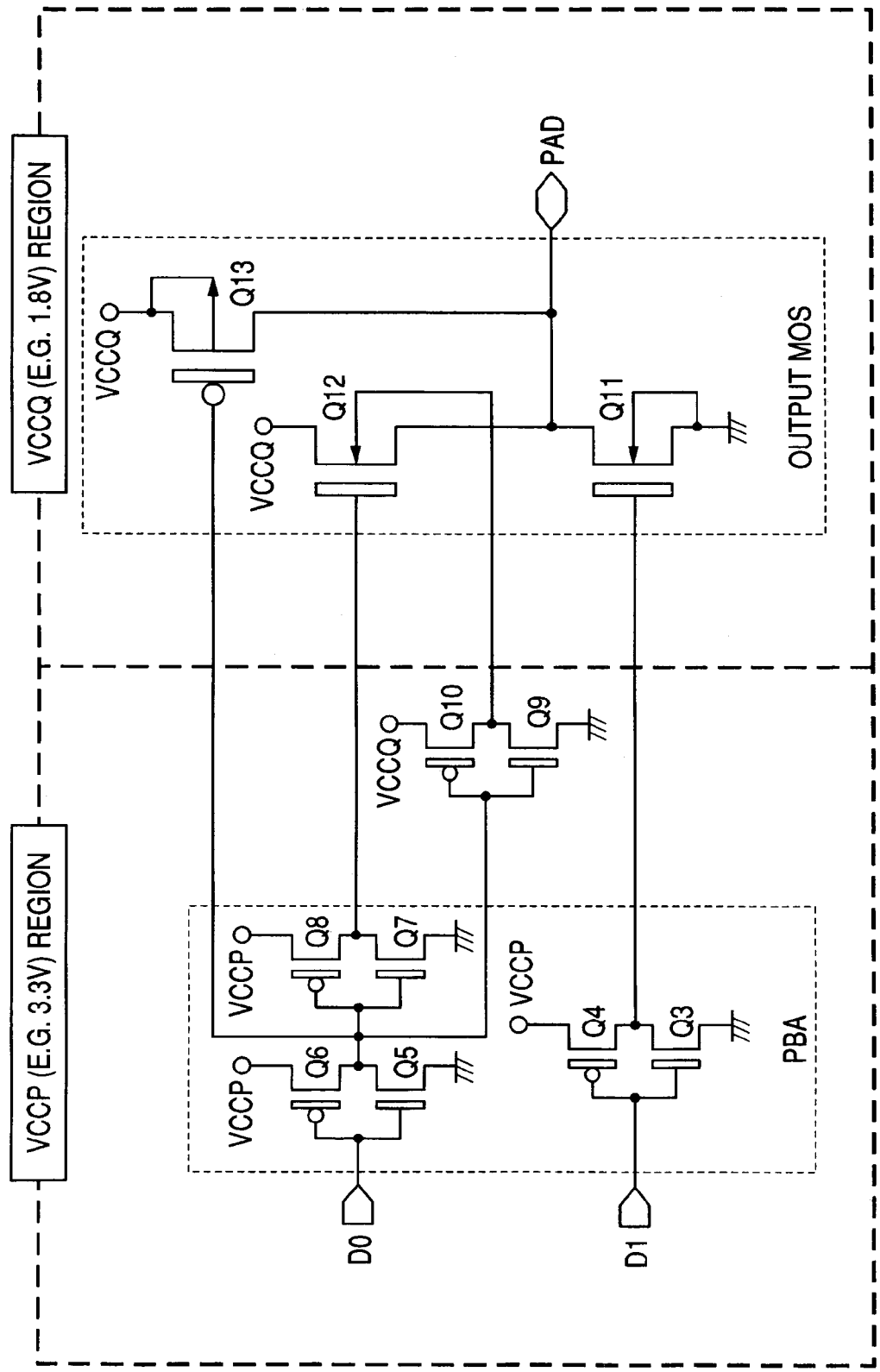
FIG. 5 is a circuit diagram showing an example of a 1.8V output circuit in FIG. 1.

FIG. 5 is a circuit diagram showing an example of the 1.8V output circuit. In the input/output circuit of the semiconductor integrated circuit according to the present invention, as described above, the level shifter L/S (UP), the three-state output control circuit 3STC, and the ESD protection element of the 3.3V IOB and those of the 1.8V IOB are similar to each other. Consequently, in FIG. 5, the level shifter L/S (UP), the three-state output control circuit 3STC, and the ESD protection element are not shown but the pre-buffer PBA and the output MOS are illustrated.

The output MOSFET is constructed by N-channel MOSFETs Q11 and Q12. To generate a high-level signal corresponding to the power source voltage VCCQ such as 1.8V and a low-level signal corresponding to the ground potential of the circuit by complementarily switching the MOSFETs Q11 and Q11, drive signals are generated by the pre-buffer PBA. A drive signal transmitted to the gate of the output MOSFET Q12 on the power source voltage VCCQ side is generated by CMOS inverter circuits described below. An input signal D0 generated by the not-shown level shifter circuit is supplied via a CMOS inverter circuit constructed by an N-channel MOSFET Q5 and a P-channel MOSFET Q6 and a CMOS inverter circuit constructed by an N-channel MOSFET Q7 and a P-channel MOSFET Q8 to the gate of the output MOSFET Q12. A drive signal transmitted to the gate of the output MOSFET Q11 on the ground potential side of the circuit is generated by a CMOS inverter circuit constructed by an N-channel MOSFET Q3 and a P-channel MOSFET Q4 receiving an input signal D1 generated by the not-shown level shifter circuit.

To set the output high-impedance state, the input signal D0 to the pre-buffer PBA is set to the low level, and the input signal D1 is set to the high level. In the pre-buffer PBA, the gate voltages of the MOSFETs Q11 and Q12 are set to the low level, both of the output MOSFETs Q11 and Q12 are turned off, and the output high-impedance state is set. To generate a low-level output signal, the input signals D0 and D1 to the pre-buffer PBA are set to the low level. In response to the low level of the input signals D0 and D1, the pre-buffer PBA sets the MOSFET Q11 to the on state and sets the MOSFET Q12 to the off state, thereby generating a low-level output signal. At the time of generating a high-level output signal, the input signals D0 and D1 to the pre-buffer PBA are set to the high level. In response to the high level of the input signals D0 and D1, the pre-buffer PBA sets the MOSFET Q11 to the off state and sets the MOSFET Q12 to the on state, thereby generating a high-level output signal.

As described above, the N-channel output MOSFET Q11 generates an output signal on the side of the ground potential of the circuit, and the N-channel output MOSFET Q12 generates an output signal on the side of the power source voltage VCCQ such as 1.8V. That is, the MOSFET Q12 on the side of the power source voltage VCCQ performs source follower output operation. In such a source follower output MOSFET, the level of a source output signal drops only by the amount of a threshold voltage from the gate voltage. In the embodiment, the drive signal corresponding to the power source voltage VCCP such as 3.3V higher than the power source voltage VCCQ is supplied from the CMOS inverter circuit (Q7 and Q8) as a component of the pre-buffer PBA to the gate of the MOSFET Q12. Consequently, the source output can be set to the high level as the power source voltage VCCQ. The N-channel output MOSFET Q11 for generating an output signal such as the ground potential of the circuit is also driven by the CMOS inverter circuit (Q3 and Q4) as a component of the pre-buffer PBA. Therefore, a high-level drive signal corresponding to the power source voltage VCCP such as 3.3V higher than the power source voltage VCCQ is supplied to the gate of the MOSFET Q11. In such a manner, a large drive current can be generated by the MOSFET of smaller size.

Further, in the embodiment, to the substrate gate (channel or well) of the output MOSFET Q12 on the side of the power source voltage VCCQ, an output signal of a CMOS inverter circuit constructed by an N-channel MOSFET Q9 and a P-channel MOSFET Q10 and having a gate which receives an output signal of the CMOS inverter circuit (Q5 and Q6) on the preceding stage as a component of the pre-buffer PBA is supplied. With the configuration, at the time of setting the output MOSFET Q12 to the on state, a positive voltage is applied across the substrate gate and the source, thereby decreasing increase in the threshold voltage by the substrate effect.

Although not limited, a P-channel MOSFET Q13 is connected in parallel with the output MOSFET Q12. To the gate of the MOSFET Q13, an output signal of the CMOS inverter circuit (Q5 and Q6) on the preceding stage as a component of the pre-buffer PBA is supplied. With the configuration, when the MOSFET Q11 is set to the on state, the P-channel MOSFET Q13 is also turned on and an output signal is pulled up to the power source voltage VCCQ.

The pull-up operation of the P-channel MOSFET Q13 is performed without a-problem when the power source voltage VCCP is a voltage such as 3.3V. However, when the power source voltage VCCP is the lowest voltage in a fluctuation allowable range and the potential difference between the power source voltage VCCP and the power source voltage VCCQ is smaller than the threshold voltage of the MOSFET Q12, the N-channel MOSFET Q12 itself cannot pull up the output signal to the power source voltage VCCQ. In order to assure a desired output signal level more reliably in consideration of variations of the power source fluctuation allowable range and the threshold voltage of the MOSFET Q12, the MOSFET Q13 is provided. By turning on the P-channel MOSFET Q13, an operation of compensating the level insufficient amount is performed. Since the P-channel MOSFET Q13 performs only supplementary operation of compensating the level insufficient amount, it can be formed in size smaller than the output PMOS in the 3.3V IOB such as the output PMOS shown in FIG. 3.

In the embodiment, in the pre-buffer PBA, the N-channel MOSFETs Q11 and Q12 are switched by the drive signal whose amplitude is set in correspondence with the power source voltage VCCP, thereby generating an output signal corresponding to the power source voltage VCCQ. An output signal having high current supply capability can be generated by an output MOSFET of small size. As a result, a high-speed memory such as a DDR2 SDRAM can be accessed by a high-speed signal.

Figure 6:
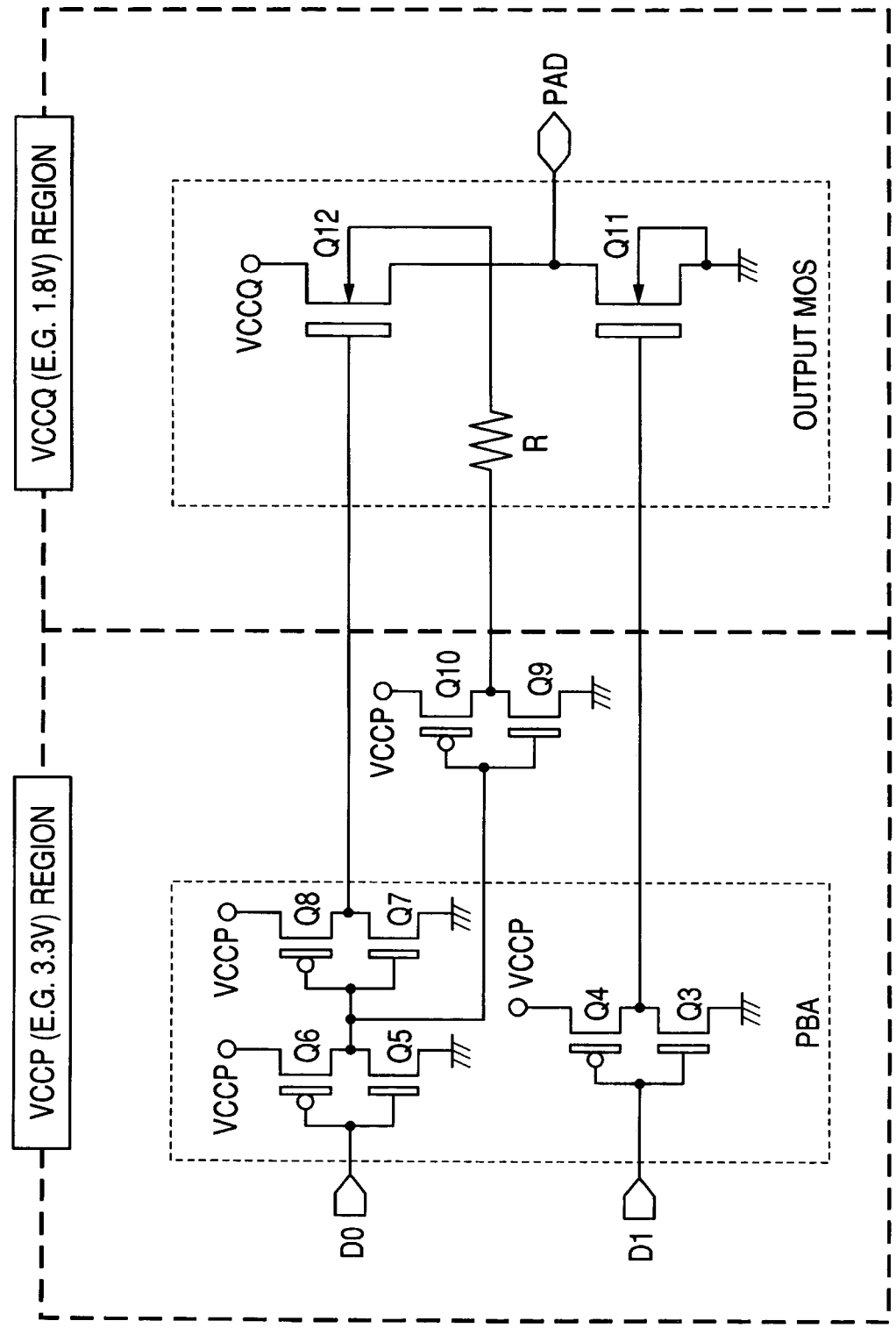
FIG. 6 is a circuit diagram showing another example of the 1.8V output circuit in FIG. 1.

FIG. 6 is a circuit diagram showing another example of the 1.8V output circuit. The example is a modification of the example of FIG. 5. To the substrate gate of the MOSFET Q12, an output signal of the CMOS inverter circuit (Q9 and Q10) of the pre-buffer PBA is transmitted via a resistor R. The resistor R operates so as to regulate direct current flowing from the substrate gate (well) of the MOSFET Q12 to the source when the MOSFET Q12 is set to the on state. In the present invention, in the 1.8V IOB, the output circuit is formed by the N-channel MOSFET. Consequently, even when forward bias is applied across the substrate gate and the source, CMOS latchup which occurs in the CMOS output circuit of the 3.3V IOB does not occur. However, current flows steadily and current consumption increases. By inserting the resistor R, the direct current can be blocked or reduced.

Figure 7:
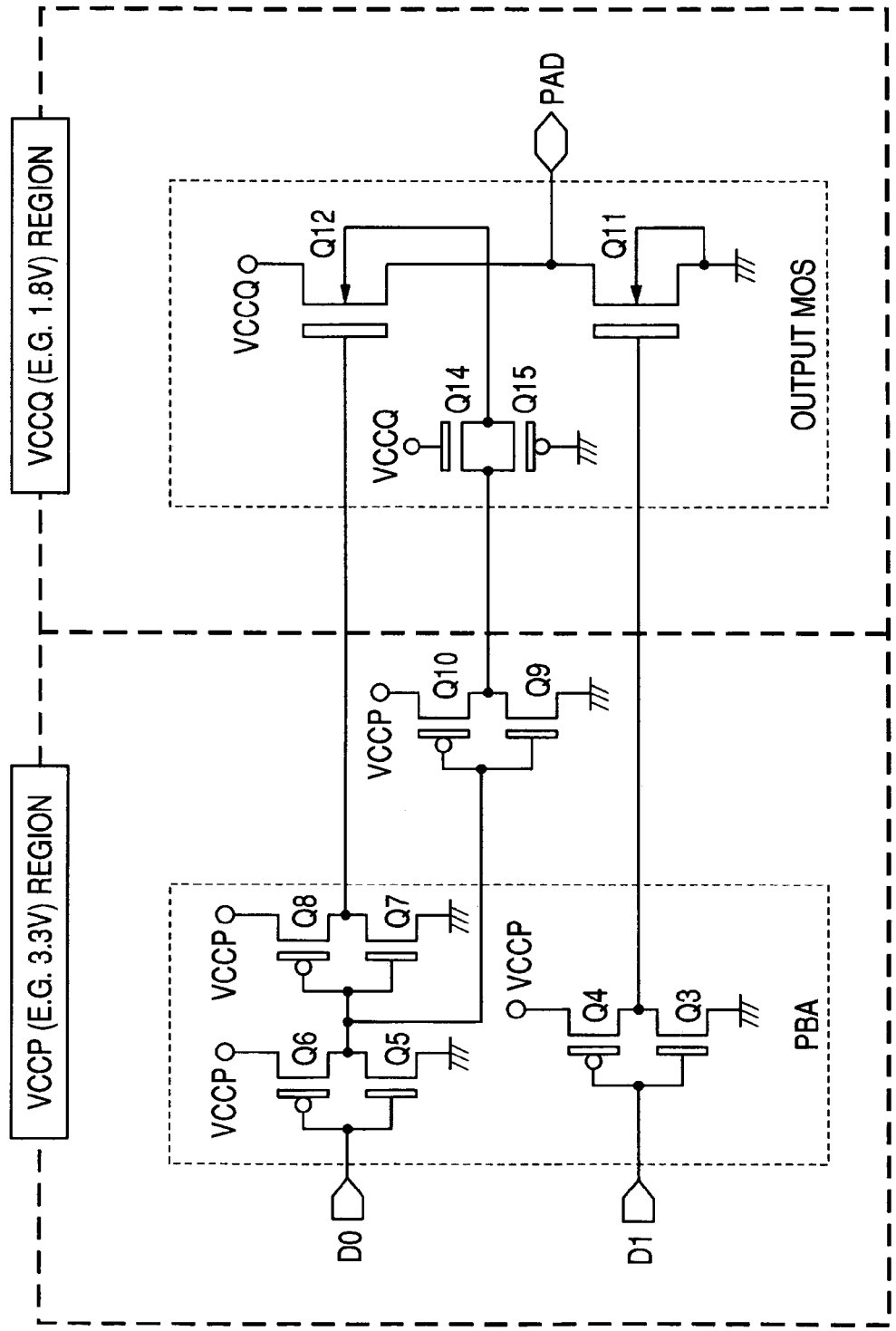
FIG. 7 is a circuit diagram showing further another example of the 1.8V output circuit in FIG. 1.

FIG. 7 is a circuit diagram showing further another example of the 1.8V output circuit. The example is a modification of the example of FIG. 6, and the resistor R performing current regulating operation is constructed by MOSFETs Q14 and Q15 which are connected in parallel. The MOSFET Q14 is an N-channel MOSFET and has a gate to which the power-source voltage VCCQ is supplied steadily. The MOSFET Q15 is a P-channel MOSFET and has a gate to which the ground potential of the circuit is supplied steadily. As described above, as the resistor R, an on-state resistance value of the MOSFETs can be also used in place of a resistive element such as a diffused resistor or a polysilicon resistor.

Figure 8:
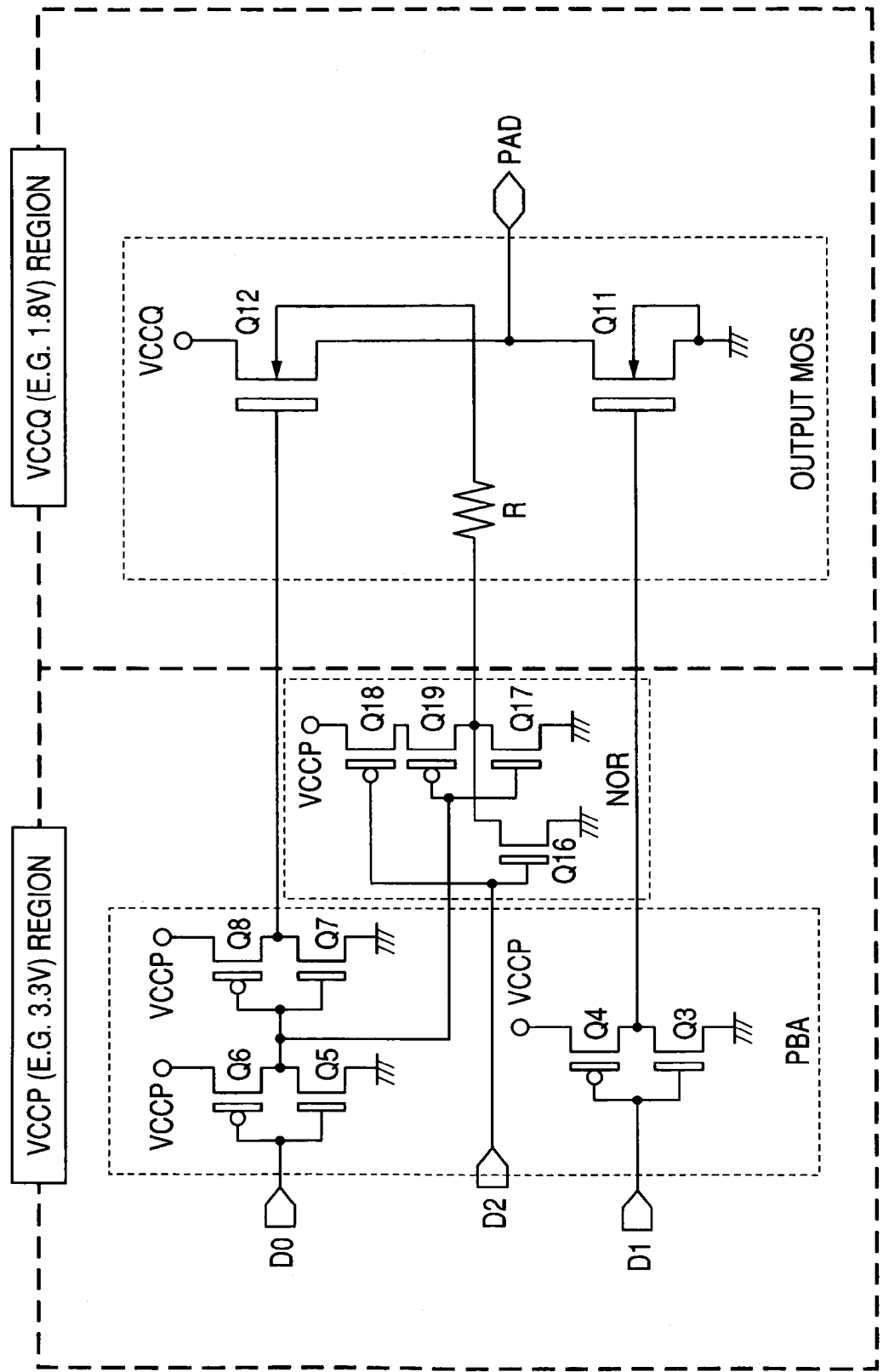
FIG. 8 is a circuit diagram showing further another example of the 1.8V output circuit in FIG. 1.

FIG. 8 is a circuit diagram showing further another example of the 1.8V output circuit. The example is a modification of the example of FIG. 6. As the pre-buffer PBA for controlling the substrate gate voltage of the MOSFET Q12, a NOR gate circuit constructed by N-channel MOSFETs Q16 and Q17 and P-channel MOSFETs Q18 and Q19 is provided. That is, the inverter circuit (Q9 and Q10) in FIG. 6 is replaced with the 2-input NOR gate. In the case of using such a NOR gate circuit, an input signal D2 is additionally used.

Figure 9:
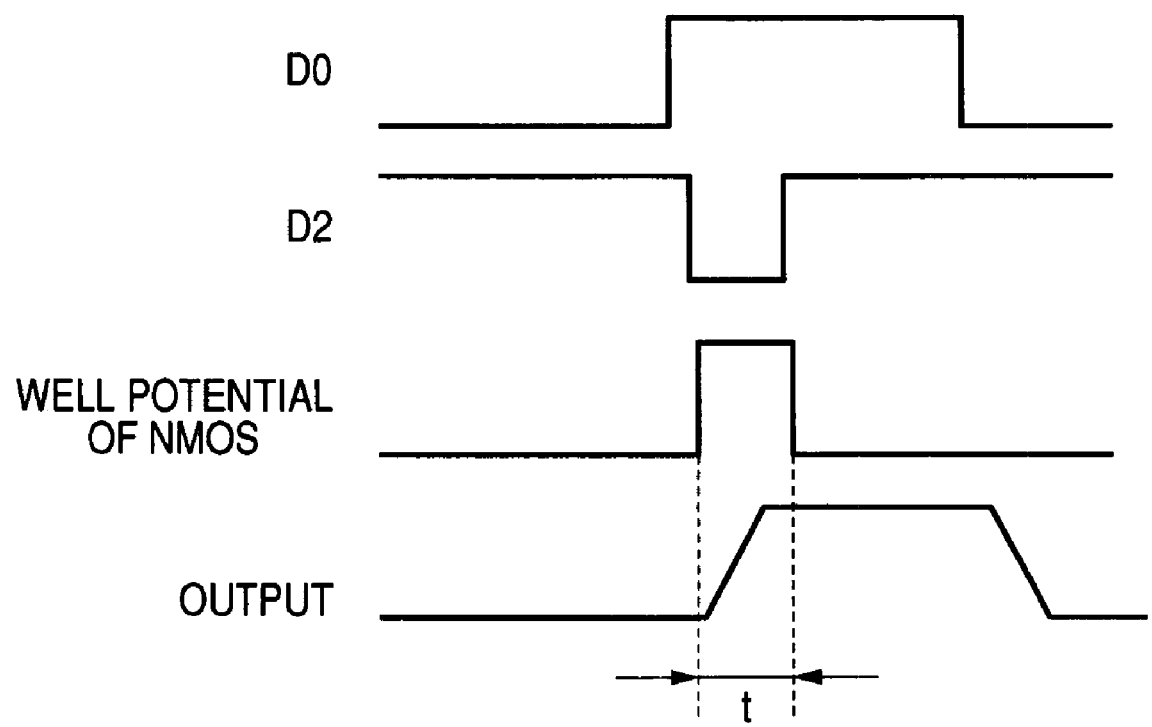
FIG. 9 is a timing chart showing an example of the operation of the 1.8V output circuit in FIG. 8.

FIG. 9 is a timing chart for explaining an example of the operation of the 1.8V output circuit in FIG. 8. When the input signal D0 changes from the low level to the high level to turn on the output MOSFET Q12, the input signal D2 is temporarily set to the low level. Only for a period in which the input signal D2 is at the low level, the well potential of the output NMOS becomes the high level (VCCP), the threshold voltage of the MOSFET Q12 at the time of increasing the output from the low level to the high level is lowered, and an output is increased by large drive current. When the output increases to the high level, the input signal D2 becomes high, and the well potential of the output MNOS is reset to the low level, thereby reducing leak current (direct current). As described above, the period "t" in which the input signal D2 is set to the low level is set to be slightly longer than the rise time of the output from the low level to the high level.

Figure 10:
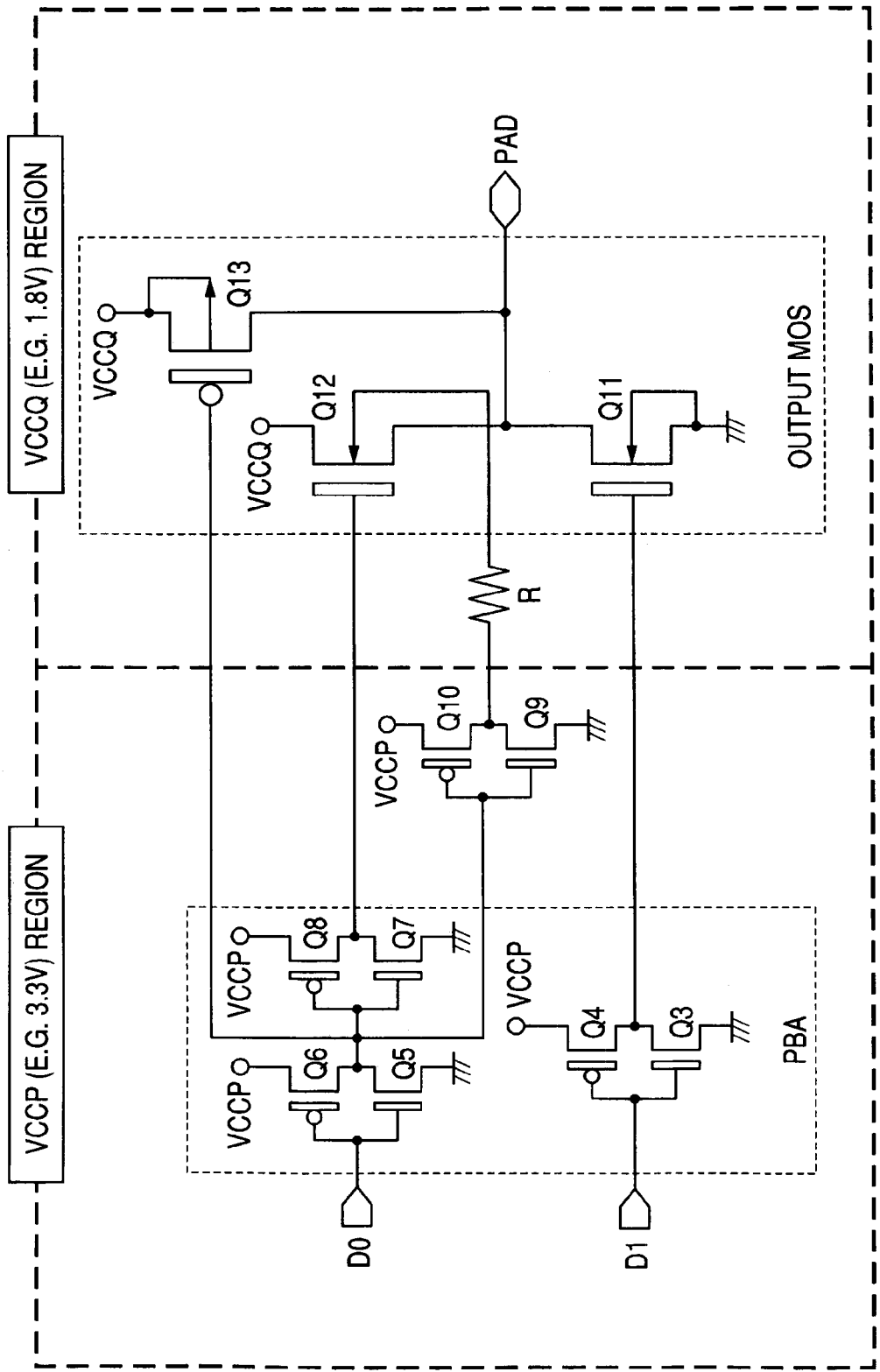
FIG. 10 is a circuit diagram showing further another example of the 1.8V output circuit in FIG. 1.

FIG. 10 is a circuit diagram showing further another example of the 1.8V output circuit. The example is a modification of the example of FIG. 6, and the P-channel MOSFET Q13 for pull-up as shown in FIG. 5 is provided in parallel with the MOSFET Q12. Such a P-channel MOSFET Q13 for pull-up may be also provided in the circuits in the examples of FIGS. 7 and 8. In particular, in the example of FIG. 8, the MOSFET Q13 operates to maintain the high level even when leak current flowing to the load side is large.

Figure 11:
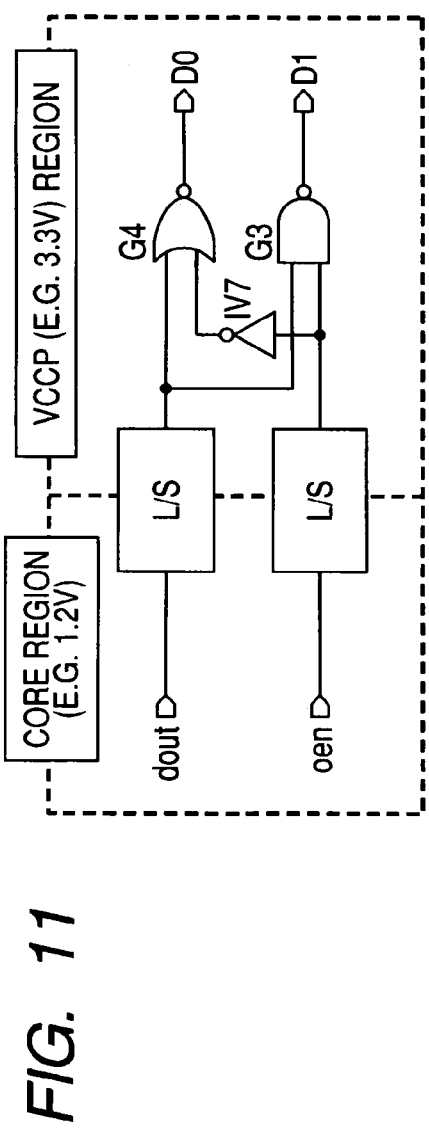
FIG. 11 is a block diagram showing an example of a three-state output control circuit provided for the 1.8V output circuit in FIG. 1.

FIG. 11 is a block diagram showing an example of a three-state output control circuit provided for the 1.8V output circuit. In the example, gate circuits of the three-state output control circuit 3STC for receiving output signals of the level shifters L/S are disposed in positions opposite to those of the gate circuits in FIG. 4. Specifically, a NAND gate circuit G3 is used as the gate circuit for generating the drive signal D1 to the N-channel output MOSFET Q11, and a NOR gate circuit G4 is used as the gate circuit for generating the drive signal D0 to the N-channel output MOSFET Q12. Accordingly, an output control signal oen generated in the core region is an inversion signal of the output control signal oe in FIG. 4. The inverter circuit is omitted, and output signals of the gate circuits G3 and G4 are transmitted as input signals to the pre-buffer PBA.

Figure 12:
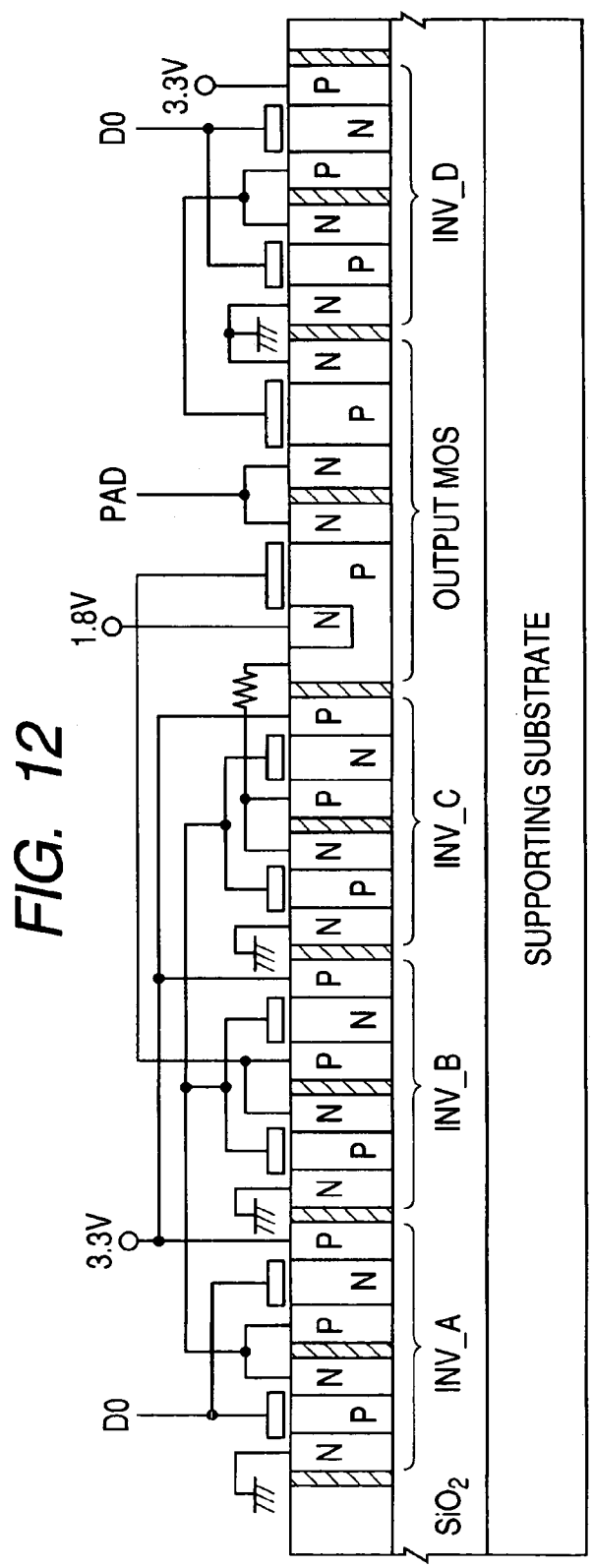
FIG. 12 is a schematic device cross section showing an example of the 1.8V output circuit in FIG. 1.

FIG. 12 is a schematic device cross section of an example of the 1.8V output circuit. In the diagram, an example of the circuit elements illustrated in FIG. 6 is shown. A silicon oxide film $SiO_2$ is provided on the surface of a supporting substrate made of silicon or the like, and N-type semiconductor regions N and P-type semiconductor regions P are formed on the silicon oxide film $SiO_2$. The N-type and P-type semiconductor regions have an SOI structure in which the bottom side is isolated by the silicon oxide film $SiO_2$ and the periphery is isolated by insulation isolating means made of a U groove and an oxide film formed in the U groove.

A P-channel MOSFET is formed in the N-type semiconductor regions. The P-channel MOSFET is constructed by a pair of source and drain regions in the P layer, a gate insulating film formed on the surface of the N-type semiconductor region between the source and drain regions, and a gate electrode made of conductive polysilicon formed on the gate insulating film. An N-channel MOSFET is formed in the P-type semiconductor regions. The N-channel MOSFET is constructed by a pair of source and drain regions in the N layer, a gate insulating film formed on the surface of the P-type semiconductor region between the source and drain regions, and a gate electrode made of conductive polysilicon formed on the gate insulating film.

The output MOS on the power source voltage (1.8V) side is provided with a contact point of a resistor for supplying a bias voltage to the P-type semiconductor region on the outside of the N layer constructing the source. A CMOS inverter circuit INV-D corresponds to the CMOS inverter circuit (Q3 and Q4) in FIG. 6, INV-C corresponds to the CMOS inverter circuit (Q9 and Q10) in FIG. 6, and INV-A and INV-B correspond to the CMOS inverter circuits (Q5 and Q6) and (Q7 and Q8) in FIG. 6. To the contact part of sources of the N-channel MOSFET and the P-channel MOSFET constructing each of the CMOS inverter circuits, a diffusion layer extended from the substrate gate below the gate electrode is electrically connected and a bias voltage is applied. In such an SOI structure, the MOSFETs can be formed so as to be isolated from each other. Consequently, the SOI structure is a convenient device structure to eliminate the influence of the substrate effect by changing the voltage of the substrate gate in accordance with the gate voltage like in the output MOSFET Q12.

Although the present invention achieved by the inventors herein has been concretely described above on the basis of the embodiments, obviously, the present invention is not limited to the foregoing embodiments but can be variously changed without departing from the gist. For example, a circuit block operating on 1.8V or 3.3V may be provided for the core region as necessary. The power source voltage VDD (1.2V or less) of the core region may be generated by decreasing 1.8V or 3.3V by an internal power source circuit. The present invention can be widely used for a semiconductor integrated circuit having an input/output circuit adapted to two kinds of power source voltages such as a high voltage and a low voltage.

What is claimed is:

1. A semiconductor integrated circuit comprising:
    a first input/output circuit operating on a first power source voltage;
    an internal circuit operating on a second power source voltage lower than the first power source voltage; and
    a second input/output circuit operating on a third power source voltage lower than the first power source voltage,
    wherein the first input/output circuit includes a first level shifter for converting a signal having signal amplitude corresponding to the second power source voltage to a first signal having signal amplitude corresponding to the first power source voltage, and a first output circuit constructed by a first P-channel MOSFET and a first N-channel MOSFET for generating an output signal having signal amplitude corresponding to the first power source voltage in response to the first signal generated by the first level shifter, and
    wherein the second input/output circuit includes a second level shifter for converting a signal having signal amplitude corresponding to the second power source voltage to a second signal having signal amplitude corresponding to the first power source voltage, and a second output circuit constructed by second and third N-channel MOSFETs for generating an output signal having signal amplitude corresponding to the third power source voltage in response to the second signal generated by the second level shifter.

2. The semiconductor integrated circuit according to claim 1,
    wherein the first input/output circuit further comprises a first output control circuit for receiving an output signal of the first level shifter and generating a three-state output control signal, and a first pre-buffer for receiving an output signal of the first output control circuit and generating a drive signal which is supplied to gates of the first P-channel MOSFET and the first N-channel MOSFET in the first output circuit, and
wherein the first output control circuit and the first pre-buffer operate on the first power source voltage.

3. The semiconductor integrated circuit according to claim 2,
    wherein the second input/output circuit further comprises a second output control circuit for receiving an output signal of the second level shifter and generating a three-state output control signal, and a second pre-buffer for receiving an output signal of the second output control circuit and generating a drive voltage which is supplied to gates of the second and third N-channel MOSFETs constructing the second output circuit, and
    wherein the second output control circuit and the second pre-buffer operate on the first power source voltage.

4. The semiconductor integrated circuit according to claim 3,
    wherein the second N-channel MOSFET as a component of the second output circuit generates an output signal corresponding to ground potential of the circuit, the third N-channel MOSFET generates an output signal corresponding to the third power source voltage,
    wherein a second P-channel MOSFET smaller than the first P-channel MOSFET is connected in parallel with the third N-channel MOSFET, and
    wherein a drive signal of a phase opposite to the phase of a drive signal supplied to the gate of the third N-channel MOSFET by the second pre-buffer is supplied to the gate of the second P-channel MOSFET.

5. The semiconductor integrated circuit according to claim 4, wherein a drive signal of the same phase as that of the drive signal supplied to the gate of the third N-channel MOSFET by the second pre-buffer is supplied to a substrate gate of the third N-channel MOSFET.

6. The semiconductor integrated circuit according to claim 4, wherein a drive signal supplied to a substrate gate of the third N-channel MOSFET is transmitted via a resistive element.

7. The semiconductor integrated circuit according to claim 5, wherein the drive signal supplied to the substrate gate of the third N-channel MOSFET is temporarily set to a voltage level corresponding to the first power source voltage when an output signal of the third N-channel MOSFET changes from low level corresponding to the ground potential of the circuit to high level corresponding to the third power source voltage.

8. The semiconductor integrated circuit according to claim 3,
    wherein third power source voltage is higher than the second power source voltage,
    wherein the first input/output circuit includes an input circuit operating on the first power source voltage, and
    wherein the second input/output circuit includes an input circuit operating on the third power source voltage.

9. The semiconductor integrated circuit according to claim 8, wherein the first and second input/output circuits are constructed by MOSFETs having the same withstand voltage structure.

10. A semiconductor integrated circuit operating on a first power source voltage and second and third power source voltages each of which is lower than the first power source voltage by threshold voltage of a MOSFET or larger,
    wherein the semiconductor integrated circuit comprises an input/output circuit operating on the third power source voltage, and
    wherein the input/output circuit includes a level shifter for converting a signal having signal amplitude corresponding to the second power source voltage to a signal having signal amplitude corresponding to the first power source voltage, and a push-pull output circuit constructed by an N-channel output MOSFET for generating an output signal having signal amplitude corresponding to the third power source voltage in response to a signal generated by the level shifter,
    wherein a P-channel MOSFET is connected in parallel with an output MOSFET on a power source voltage side as a component of the push-pull output circuit, and
    wherein a drive signal of a phase opposite to that of a drive signal supplied to the gate of the output MOSFET on the power source voltage side is supplied to the gate of the P-channel MOSFET,
    wherein a drive signal of the same phase as that of the drive signal supplied to the gate of the output MOSFET on the power source voltage side is supplied to a substrate gate of the output MOSFET on the power source voltage side.

11. The semiconductor integrated circuit according to claim 10, wherein a drive signal supplied to a substrate gate of the output MOSFET on the power source voltage side is transmitted via a resistive element.

12. The semiconductor integrated circuit according to claim 11, wherein the drive signal supplied to the substrate gate of the output MOSFET on the power source voltage side is temporarily set to a voltage level corresponding to the first power source voltage when an output signal of the output MOSFET on the power source voltage side changes from low level corresponding to the ground potential of the circuit to high level corresponding to the third power source voltage.

* * * * *